United States Patent
Kuo et al.

(10) Patent No.: US 9,876,145 B2
(45) Date of Patent: Jan. 23, 2018

(54) FLIP-CHIP LIGHT EMITTING DIODE CHIP

(71) Applicant: Lextar Electronics Corporation, Hsinchu (TW)

(72) Inventors: Shiou-Yi Kuo, Kaohsiung (TW); Wen-Yuan Fan, Taoyuan (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/936,074

(22) Filed: Nov. 9, 2015

(65) Prior Publication Data

US 2016/0197239 A1    Jul. 7, 2016

(30) Foreign Application Priority Data

Jan. 5, 2015 (TW) .............................. 104100106 A

(51) Int. Cl.
*H01L 33/38* (2010.01)
*H01L 33/44* (2010.01)
*H01L 33/40* (2010.01)

(52) U.S. Cl.
CPC .......... *H01L 33/382* (2013.01); *H01L 33/405* (2013.01); *H01L 33/44* (2013.01)

(58) Field of Classification Search
CPC ......... H01L 21/00; H01L 33/46; H01L 33/48; H01L 33/62; H01L 33/00; H01L 33/10; H01L 33/382; H01L 33/60; H01L 33/42; H01L 27/15; H01L 33/44
See application file for complete search history.

(56) References Cited

U.S. PATENT DOCUMENTS

| 2005/0287687 | A1 | 12/2005 | Liao | |
| 2013/0203194 | A1* | 8/2013 | Totani | H01L 33/44 438/29 |
| 2014/0084244 | A1* | 3/2014 | Yu | H01L 33/0079 257/13 |
| 2014/0159071 | A1* | 6/2014 | Choi | H01L 27/15 257/88 |
| 2014/0361327 | A1* | 12/2014 | Chae | H01L 33/22 257/98 |

FOREIGN PATENT DOCUMENTS

| TW | M296476 | 8/2006 |
| TW | 201347226 A | 11/2013 |
| TW | 201409754 A | 3/2014 |

* cited by examiner

*Primary Examiner* — Fernando L Toledo
*Assistant Examiner* — Lawrence-Linh T Nguyen
(74) *Attorney, Agent, or Firm* — Hayes Soloway PC

(57) ABSTRACT

A flip-chip light emitting diode chip includes a first semiconductor structure, which includes a P-type semiconductor layer, a N-type semiconductor layer, openings, a reflective layer, a barrier layer, a passivation layer, and an electrical contact layer. The openings penetrate the P-type semiconductor layer and a part of the N-type semiconductor layer so as to partially expose the N-type semiconductor layer. The reflective layer is disposed on the P-type semiconductor layer. The barrier layer is disposed on the reflective layer, and the area of the barrier layer is smaller than that of the reflective layer therefore the reflective layer is exposed from the barrier layer. The passivation layer is disposed on the barrier layer and partially fills in the openings. The electrical contact layer disposed on the passivation layer partially penetrates through the passivation layer to contact the exposed part of the N-type semiconductor layer.

6 Claims, 3 Drawing Sheets

FLIP-CHIP LIGHT EMITTING DIODE CHIP

RELATED APPLICATIONS

This application claims priority to Taiwanese Application Serial Number 104100106, filed Jan. 5, 2015, which is herein incorporated by reference.

BACKGROUND

Field of Invention

The present invention relates to a flip-chip light emitting diode chip.

Description of Related Art

Recently, featuring in high directivity, energy saving, etc., light emitting diodes have been widely applied to various lighting devices and display devices. In addition to the disposition of light emitting layers in the light emitting diodes, it is usually required a proper chip structure for the light emitting diodes, so as to enhance the efficiency of the output light and also improve the reliability and lifetime of the light emitting diodes.

The chip structure of the light emitting diodes typically includes a reflective layer, which is used for redirecting the output light and enhancing the light efficiency of the light emitting diodes. The reflective layer is easily oxidized by external water vapor. After the oxidation, the reflective layer suffers the reduced reflectance and detaches or peels off easily. As a result, the structure of the light emitting diodes is often configured with elements having an ability to block the invasion of water vapor. However, these elements having the ability to block the invasion of water vapor may decrease the light intensity of the outgoing light of the light emitting diodes.

SUMMARY

The present invention provides a flip-chip light emitting diode chip. By disposing the metal layer to increase the area of blocking water vapor invasion, protecting the reflective layer from oxidation, and increasing the reflective range, the light intensity, reliability, and lifetime of the light emitting diodes are enhanced.

One aspect of the present invention provides a flip-chip light emitting diode chip, including a first semiconductor structure. The first semiconductor structure includes a first P-type semiconductor layer, a first active layer, a first N-type semiconductor layer, plural first openings, a first reflective layer, a first barrier layer, a passivation layer, and a first electrical contact layer. The first active layer is disposed between the first P-type semiconductor layer and the first N-type semiconductor layer. The first openings penetrate through the first P-type semiconductor layer and the first active layer, and partially penetrate the first N-type semiconductor layer, and a part of the first N-type semiconductor layer is exposed through the first openings. The first reflective layer is disposed on the first P-type semiconductor layer. The first barrier layer is disposed on the first reflective layer, and an area of the first barrier layer is smaller than an area of the first reflective layer, whereby the first reflective layer is exposed from the first barrier layer. The passivation layer is disposed on the first barrier layer and partially filling the first openings to cover exposed surfaces of the first P-type semiconductor layer, the first active layer, the first N-type semiconductor layer, the first reflective layer, and the first barrier layer, and the passivation layer is in contact with the exposed part of the first N-type semiconductor layer. The first electrical contact layer is disposed on the passivation layer and partially penetrates through the passivation layer to be in contact with the exposed part of the first N-type semiconductor layer.

In one or more embodiments of the present invention, the reflectance of the first reflective layer is greater than the reflectance of the first barrier layer.

In one or more embodiments of the present invention, the first electrical contact layer includes a first contact pad and plural first extension portions, the first contact pad is disposed on the passivation layer, and the first extension portions extend from the first contact pad toward the first openings and penetrate through the passivation layer to be in contact with the exposed part of the first N-type semiconductor layer.

In one or more embodiments of the present invention, the first contact pad and the first extension portions are made of metals.

In one or more embodiments of the present invention, the first semiconductor structure includes a first transparent conductive layer, disposed between the first P-type semiconductor layer and the first reflective layer.

In one or more embodiments of the present invention, the flip-chip light emitting diode chip further includes a second semiconductor structure. The second semiconductor structure includes a second P-type semiconductor layer, a second active layer, a second N-type semiconductor layer, a second reflective layer, a second barrier layer, and a second electrical contact layer. The second active layer is disposed between the second P-type semiconductor layer and the second N-type semiconductor layer. The second reflective layer is disposed on the second P-type semiconductor layer. The second barrier layer is disposed on the second reflective layer, and the passivation layer covers exposed surfaces of the second P-type semiconductor layer, the second active layer, the second N-type semiconductor layer, the second reflective layer, and the second barrier layer. The second electrical contact layer is disposed on the passivation layer and partially penetrates through the passivation layer to be in contact with the second barrier layer.

In one or more embodiments of the present invention, the second electrical contact layer includes a second contact pad and a second extension portion, the second contact pad is disposed on the passivation layer and partially penetrates through the passivation layer to be in contact with the second barrier layer, and the second extension portion extends from the second contact pad toward the second N-type semiconductor layer.

In one or more embodiments of the present invention, a side of the second reflective layer proximate to the second extension portion is exposed from the second barrier layer.

In one or more embodiments of the present invention, a side of the passivation layer proximate to the second extension portion has a side surface and a bottom surface, and the second extension portion adjoins the side surface and extends along the side surface toward the bottom surface.

Another aspect of the present invention provides a flip-chip light emitting diode chip, including a second semiconductor structure. The second semiconductor structure includes a second P-type semiconductor layer, a second active layer, a second N-type semiconductor layer, a second reflective layer, a second barrier layer, a passivation layer, and a second electrical contact layer. The second active layer is disposed between the second P-type semiconductor layer and the second N-type semiconductor layer. The second reflective layer is disposed on the second P-type semiconductor layer. The second barrier layer is disposed on the second reflective layer, and the passivation layer covers the second P-type semiconductor layer, the second active layer, the second N-type semiconductor layer, the second reflective layer, and the second barrier layer. The second electrical contact layer is disposed on the passivation layer, and the second electrical contact layer includes a second contact pad and a second extension portion. The second contact pad is disposed on the passivation layer and partially penetrates through the passivation layer to be in contact with the second barrier layer, and the second extension portion extends from the second contact pad toward the second N-type semiconductor layer.

In one or more embodiments of the present invention, a side of the second reflective layer proximate to the second extension portion is exposed from the second barrier layer.

In one or more embodiments of the present invention, a side of the passivation layer proximate to the second extension portion has a side surface and a bottom surface, and the second extension portion adjoins the side surface and extends along the side surface toward the bottom surface.

In one or more embodiments of the present invention, the flip-chip light emitting diode chip further includes a first semiconductor structure. The first semiconductor structure includes a first P-type semiconductor layer, a first active layer, a first N-type semiconductor layer, plural first openings, a first reflective layer, a first barrier layer, a passivation layer, and a first electrical contact layer. The first active layer is disposed between the first P-type semiconductor layer and the first N-type semiconductor layer. The first openings penetrate through the first P-type semiconductor layer and the first active layer, and partially penetrate the first N-type semiconductor layer, and a part of the first N-type semiconductor layer is exposed through the first openings. The first reflective layer is disposed on the first P-type semiconductor layer. The first barrier layer is disposed on the first reflective layer, and an area of the first barrier layer is smaller than an area of the first reflective layer, whereby the first reflective layer is exposed from the first barrier layer. The passivation layer is disposed on the first barrier layer and partially filling the first openings to cover exposed surfaces of the first P-type semiconductor layer, the first active layer, the first N-type semiconductor layer, the first reflective layer, and the first barrier layer, and the passivation layer is in contact with the exposed part of the first N-type semiconductor layer. The first electrical contact layer is disposed on the passivation layer and partially penetrates through the passivation layer to be in contact with the exposed part of the first N-type semiconductor layer.

In one or more embodiments of the present invention, the reflectance of the first reflective layer is greater than the reflectance of the first barrier layer.

In one or more embodiments of the present invention, the first electrical contact layer includes a first contact pad and plural first extension portions, the first contact pad is disposed on the passivation layer, and the first extension portions extend from the first contact pad toward the first openings and penetrate through the passivation layer to be in contact with the exposed part of the first N-type semiconductor layer.

In one or more embodiments of the present invention, the first contact pad and the first extension portions are made of metals.

In one or more embodiments of the present invention, the first semiconductor structure includes a first transparent conductive layer, disposed between the first P-type semiconductor layer and the first reflective layer.

In one or more embodiments of the present invention, the flip-chip light emitting diode chip further includes a first reflective layer, a first barrier layer, and a first electrical contact layer. The first reflective layer is disposed on an area of the second N-type semiconductor layer where the second active layer is not disposed. The first barrier layer is disposed on the first reflective layer and covers the first reflective layer. The first electrical contact layer is disposed on the first barrier layer, in which the passivation layer is disposed between the first barrier layer and the first electrical contact layer, and the passivation layer includes a passivation layer opening connecting the first barrier layer and the first electrical contact layer.

BRIEF DESCRIPTION OF THE DRAWINGS

The invention can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Figure 1:
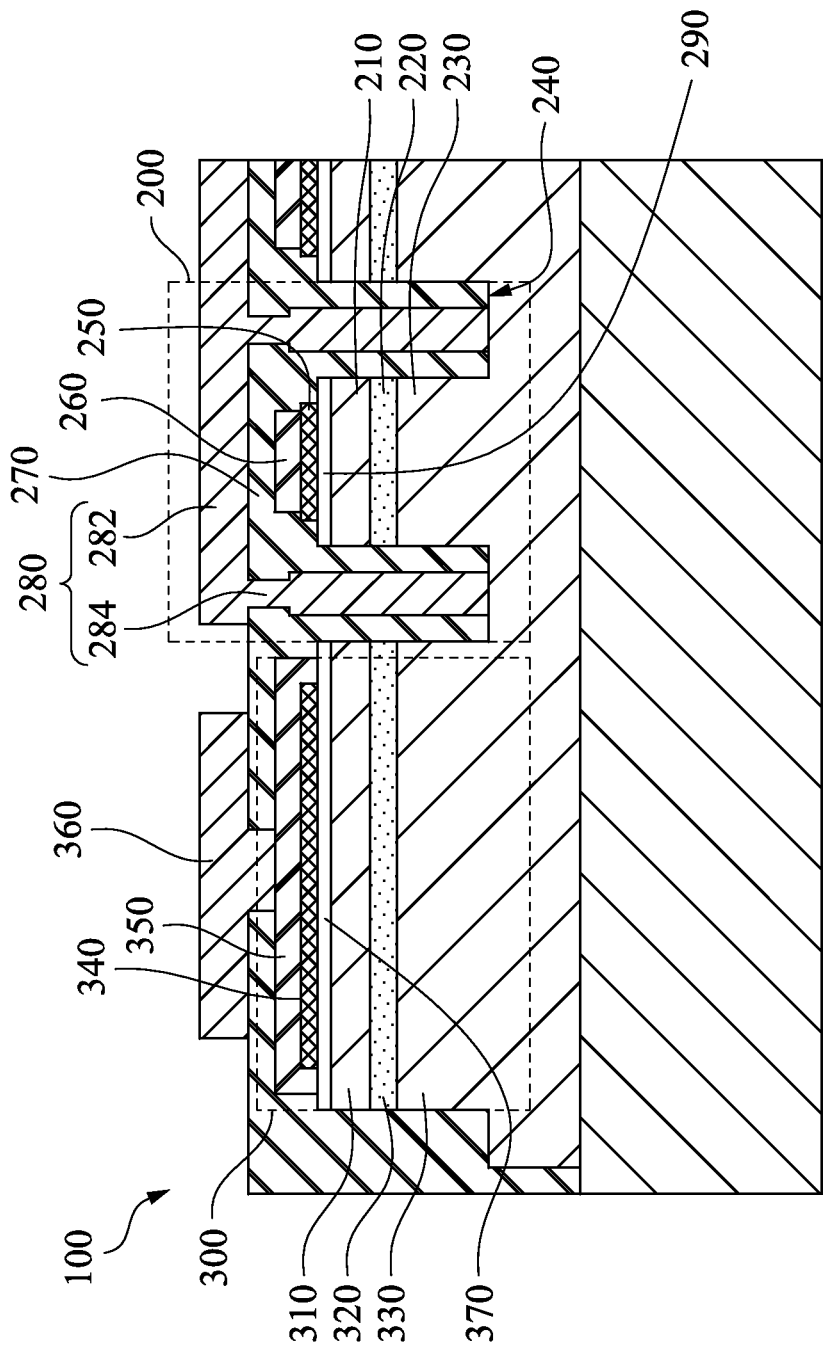
FIG. 1 is a cross-sectional view of the flip-chip light emitting diode chip according to one embodiment of the present invention.

FIG. 1 is a cross-sectional view of the flip-chip light emitting diode chip 100 according to one embodiment of the present invention. The flip-chip light emitting diode chip 100 includes a first semiconductor structure 200. The first semiconductor structure 200 includes a first P-type semiconductor layer 210, a first active layer 220, a first N-type semiconductor layer 230, plural first openings 240, a first reflective layer 250, a first barrier layer 260, a passivation layer 270, and a first electrical contact layer 280. The first P-type semiconductor layer 210 is disposed on the first N-type semiconductor layer 230, and the first active layer 220 is disposed between the first P-type semiconductor layer 210 and the first N-type semiconductor layer 230. The first openings 240 penetrate through the first P-type semiconductor layer 210 and the first active layer 220, and partially penetrate the first N-type semiconductor layer 230, and a part of the first N-type semiconductor layer 230 is exposed through the first openings 240. The first reflective layer 250 is disposed on the first P-type semiconductor layer 210. The first barrier layer 260 is disposed on the first reflective layer 250. The passivation layer 270 is disposed on the first barrier layer 260 and partially filling the first openings 240 to cover exposed surfaces of the first P-type semiconductor layer 210, the first active layer 220, the first N-type semiconductor layer 230, the first reflective layer 250, and the first barrier layer 260, and the passivation layer 270 is in contact with the exposed part of the first N-type semiconductor layer 230. The first electrical contact layer 280 is disposed on the passivation layer 270 and partially penetrates through the passivation layer 270 to be in contact with the exposed part of the first N-type semiconductor layer 230.

In this embodiment, the first reflective layer 250 is configured to reflect the light. The first barrier layer 260 is configured to protect and secure the first reflective layer 250 from oxidation or peeling. In one or more embodiments of the present invention, the reflectance of the first reflective layer 250 is greater than the reflectance of the first barrier layer 260. In addition, the first reflective layer 250 and the first barrier layer 260 can be made of conductive materials ideally. For example, the materials of the first reflective layer 250 can be silver, aluminum, silver alloy, or the combination thereof. The materials of the first barrier layer 260 can be titanium, platinum, gold, nickel, tungsten, tungsten titanium alloy, aluminum, silver alloy, or the combination thereof.

In one or more embodiments of the present invention, the first semiconductor structure 200 further includes a first transparent conductive layer 290, disposed between the first P-type semiconductor layer 210 and the first reflective layer 250. The first transparent conductive layer 290 improves the distribution of the electric current between the first P-type semiconductor layer 210 and the first reflective layer 250. It should be noted that, the first transparent conductive layer 290 is not a necessary configuration, but an optional configuration.

In this embodiment, the first electrical contact layer 280 includes a first contact pad 282 and plural first extension portions 284. The first contact pad 282 is disposed on the passivation layer 270, and the first extension portions 284 extend from the first contact pad 282 toward the first openings 240 and penetrate through the passivation layer 270 to be in contact with the exposed part of first N-type semiconductor layer 230. Herein, the first openings 240 are disposed at the periphery of the first reflective layer 250, so that the first extension portions 284 are also disposed at the periphery of the first reflective layer 250.

Herein, the first contact pad 282 and the first extension portions 284 are made of metals with an ability to conduct electricity, so that the first electrical contact layer 280 can be electrically connected to the first N-type semiconductor layer 230. Instead of the materials of the passivation layer, the metal materials have an advantage of stopping the invasion of water vapor. In this way, by disposing the first electrical contact layer 280 at the periphery of the first reflective layer 250, the path of water vapor transmitted from the outside, through the passivation layer 270, to the reflective layer 250 is limited, and therefore the first reflective layer 250 are more fully protected from oxidation.

In one or more embodiments of the present invention, the flip-chip light emitting diode chip 100 further includes a second semiconductor structure 300. The second semiconductor structure 300 includes a second P-type semiconductor layer 310, a second active layer 320, a second N-type semiconductor layer 330, a second reflective layer 340, a second barrier layer 350, a second electrical contact layer 360, and a second transparent conductive layer 370. The configuration of the second semiconductor structure 300 is substantially similar to that of the first semiconductor structure 200, and the difference is that the second electrical contact layer 360 is connected to the second barrier layer 350 instead of the second N-type semiconductor layer 330. The materials of the second barrier layer 350 can be titanium, platinum, gold, nickel, tungsten, tungsten titanium alloy, aluminum, silver alloy, or the combination thereof.

As a result, the second electrical contact layer 360 can be connected to the second P-type semiconductor layer 310 through the second barrier layer 350, the second reflective layer 340, and the second transparent conductive layer 370. In one or more embodiments of the present invention, the first P-type semiconductor layer 210 and the second P-type semiconductor layer 310 are of the same layer, and the first N-type semiconductor layer 230 and the second N-type semiconductor layer 330 are of the same layer. To be specific, the first P-type semiconductor layer 210 and the second P-type semiconductor layer 310 are mutually connected, and the first N-type semiconductor layer 230 and the second N-type semiconductor layer 330 are mutually connected. Therefore, the second electrical contact layer 360 is electrically connected to the second P-type semiconductor 310 and the first P-type semiconductor layer 210, and the first electrical contact layer 280 is electrically connected to the first N-type semiconductor layer 230 and the second N-type semiconductor layer 330.

In this embodiment, through the first electrical contact layer 280 and the second electrical contact layer 360, the first semiconductor structure 200 and the second semiconductor structure 300 of the flip-chip light emitting diode chip 100 can be operated and controlled to emit light.

In this embodiment, since the configuration of the first electrical contact layer 280 can protect the first reflective layer 250 from the invasion of water vapor, the first reflective layer 250 is less dependent on the protection provided by the first barrier layer 260. The area of the first barrier layer 260 can be designed to be smaller than the area of the first reflective layer 250, so that the first reflective layer 250 is exposed from the first barrier layer 260. In this way, the light is prevented from traveling to the first barrier layer 260 which may absorb the light, and therefore the intensity of the output light can be enhanced. According to experimental results, adopting the configuration of the embodiment, the intensity of the output light of the flip-chip light emitting diode chip is increased by 2 to 6%.

Figure 2:
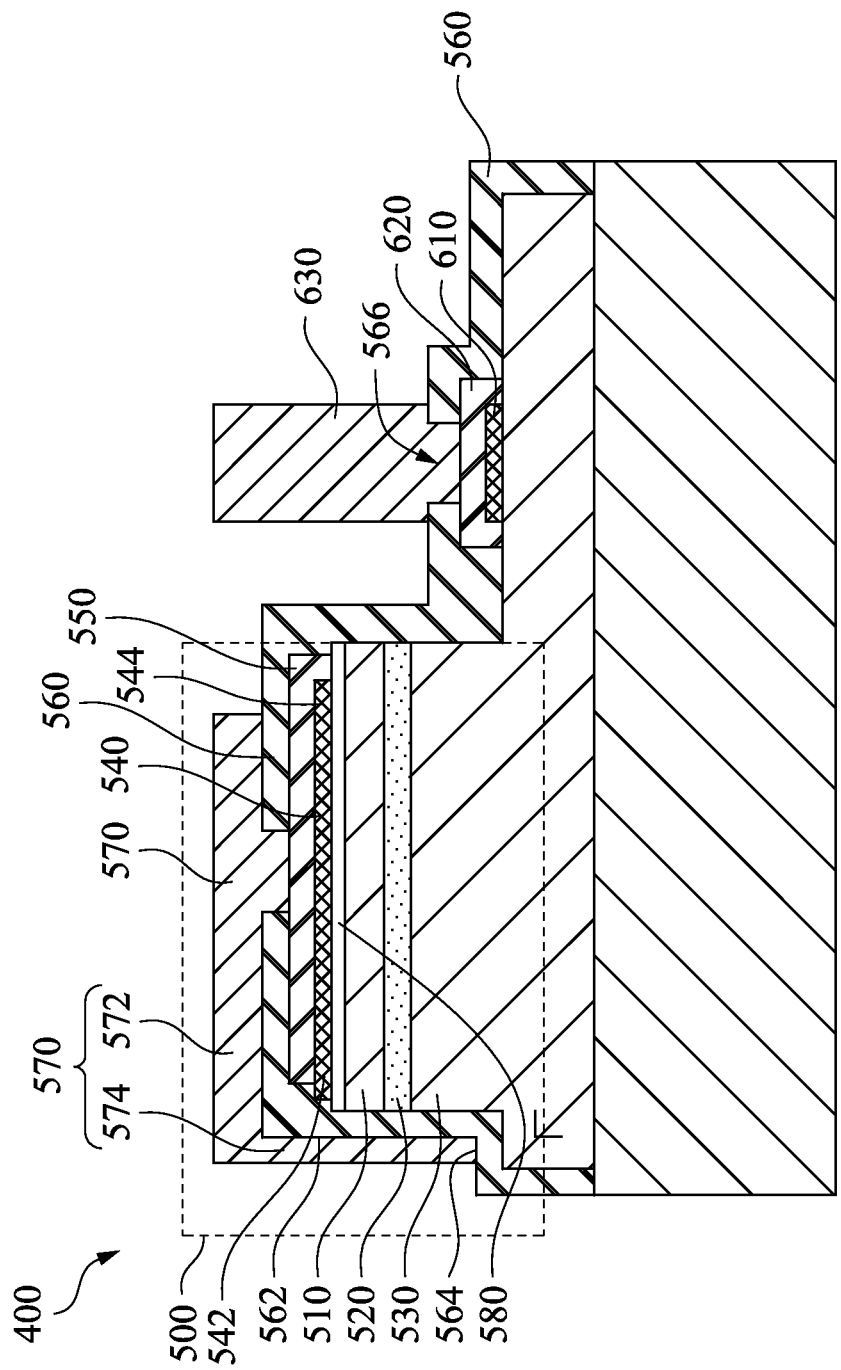
FIG. 2 is a cross-sectional view of the flip-chip light emitting diode chip according to another embodiment of the present invention.

FIG. 2 is a cross-sectional view of the flip-chip light emitting diode chip 400 according to another embodiment of the present invention. In this embodiment, another flip-chip light emitting diode chip 400 is designed based on the concept of blocking the water vapor invasion by metal materials, as indicated in FIG. 1.

The flip-chip light emitting diode chip 400 includes a second semiconductor structure 500. The second semiconductor structure 500 includes a second P-type semiconductor layer 510, a second active layer 520, a second N-type semiconductor layer 530, a second reflective layer 540, a second barrier layer 550, a passivation layer 560, and a second electrical contact layer 570. The second P-type semiconductor layer 510 is disposed on the second N-type semiconductor layer 530, and the second active layer 520 is disposed between the second P-type semiconductor layer 510 and the second N-type semiconductor layer 530. The second reflective layer 540 is disposed on the second P-type semiconductor layer 510. The second barrier layer 550 is disposed on the second reflective layer 540. The passivation layer 560 also covers the second P-type semiconductor layer 510, the second active layer 520, the second N-type semiconductor layer 530, the second reflective layer 540, and the second barrier layer 550. The second electrical contact layer 570 is disposed on the passivation layer 560. It is noted that, in comparison to the embodiment of FIG. 1, in this embodiment, the second electrical contact layer 570 includes a second contact pad 572 and a second extension portion 574. The second contact pad 572 is disposed on the passivation layer 560 and partially penetrates through the passivation layer 560 to be in contact with the second barrier layer 550, and the second extension portion 574 extends from the second contact pad 572 toward the second N-type semiconductor layer 530.

To be specific, a side of the passivation layer 560 proximate to the second extension portion 574 has a side surface 562 and a bottom surface 564, and the second extension portion 574 adjoins the side surface 562 and extends along the side surface 562 toward the bottom surface 564. The second extension portion 574 should be configured to be as close to the second N-type semiconductor layer 530 as possible, but does not connect the second N-type semiconductor layer 530, so that it is difficult for the water vapor to pass through the interval between the second extension portion 574 and the second N-type semiconductor layer 530. Therefore, the path of water vapor transmitted from the outside, through the passivation layer 560, to the second reflective layer 540 is blocked by the second extension portion 574, and the invasion of water vapor is less easy.

In one or more embodiments of the present invention, since the configuration of the second extension portion 574 stops the invasion of water vapor, a side of the second reflective layer 540 proximate to second extension portion 574, for example, an end 542 of the second reflective layer 540, can be exposed from the second barrier layer 550. The other end 544 of the second reflective layer 540 is still covered and protected from the invasion of the water vapor by the second barrier layer 550.

As the previous description, in one or more embodiments, the second semiconductor 500 can further include a second transparent conductive layer 580, disposed between the second P-type semiconductor layer 510 and the second reflective layer 540. The second transparent conductive layer 580 can improve the distribution of electric current between the second P-type semiconductor layer 510 and the second reflective layer 540. It is noted that, the second transparent conductive layer 580 is merely an optional configuration, but not a necessary configuration.

As the embodiment of FIG. 1, in this embodiment, the reflectance of the second reflective layer 540 is greater than the reflectance of the second barrier layer 550. The materials of the second barrier layer 550 can be titanium, platinum, gold, nickel, tungsten, tungsten titanium alloy, aluminum, silver alloy, or the combination thereof. Other relevant details are substantially the same as that shown in the embodiment of FIG. 1, and thereto not repeated herein.

In one or more embodiments of the present invention, the flip-chip light emitting diode chip 400 further includes a first reflective layer 610, a first barrier layer 620, and a first electrical contact layer 630. The first reflective layer 610 is disposed on a position of the second N-type semiconductor layer 530 where the second active layer 520 is not disposed. The first barrier layer 620 is disposed on the first reflective layer 610 and covers the first reflective layer 610. Herein, the first reflective layer 610 can be configured to be totally surrounded by the first barrier layer 620 and the second N-type semiconductor layer 530, and therefore is not exposed. The first electrical contact layer 630 is disposed on the first barrier layer 620. The passivation layer 560 can be disposed between the first barrier layer 620 and the first electrical contact layer 630. The passivation layer 560 includes a passivation layer opening 566 connecting the first barrier layer 620 and the first electrical contact layer 630, so that the first barrier layer 620 and the first electrical contact layer 630 are electrically connected.

In one or more embodiments of the present invention, the materials of the first reflective layer 610 is similar to the materials of the second reflective layer 540, and the materials of the first barrier layer 620 is similar to the materials of the second barrier layer 550. In the fabrication aspect, the first reflective layer 610 and the second reflective layer 540 can be disposed by the same step, and the first barrier layer 620 and the second barrier layer 550 can be disposed by the same step.

In this way, the first electrical contact layer 630 is electrically connected to the second N-type semiconductor layer 530. Through the first electrical contact layer 630 and the second electrical contact layer 570 of the second semiconductor structure 500, the flip-chip light emitting diode chip can be controlled and operated electrically.

In this embodiment, the second barrier layer 550 does not fully cover the end 542 of the second reflective layer 540. Therefore, near a side of the second extension portion 574, the light coming from the second active layer 520 is not transmitted to the second barrier layer 550, and therefore is not reflected by the second barrier layer 550, but reflected by the second reflective layer 540. Since the second reflective layer 540 has a higher reflectance, the intensity of the output light can be enhanced. Also, with the configuration of the second electrical contact layer 570, the exposed second reflective layer 540 can be protected by blocking the invasion of water vapor.

Figure 3:
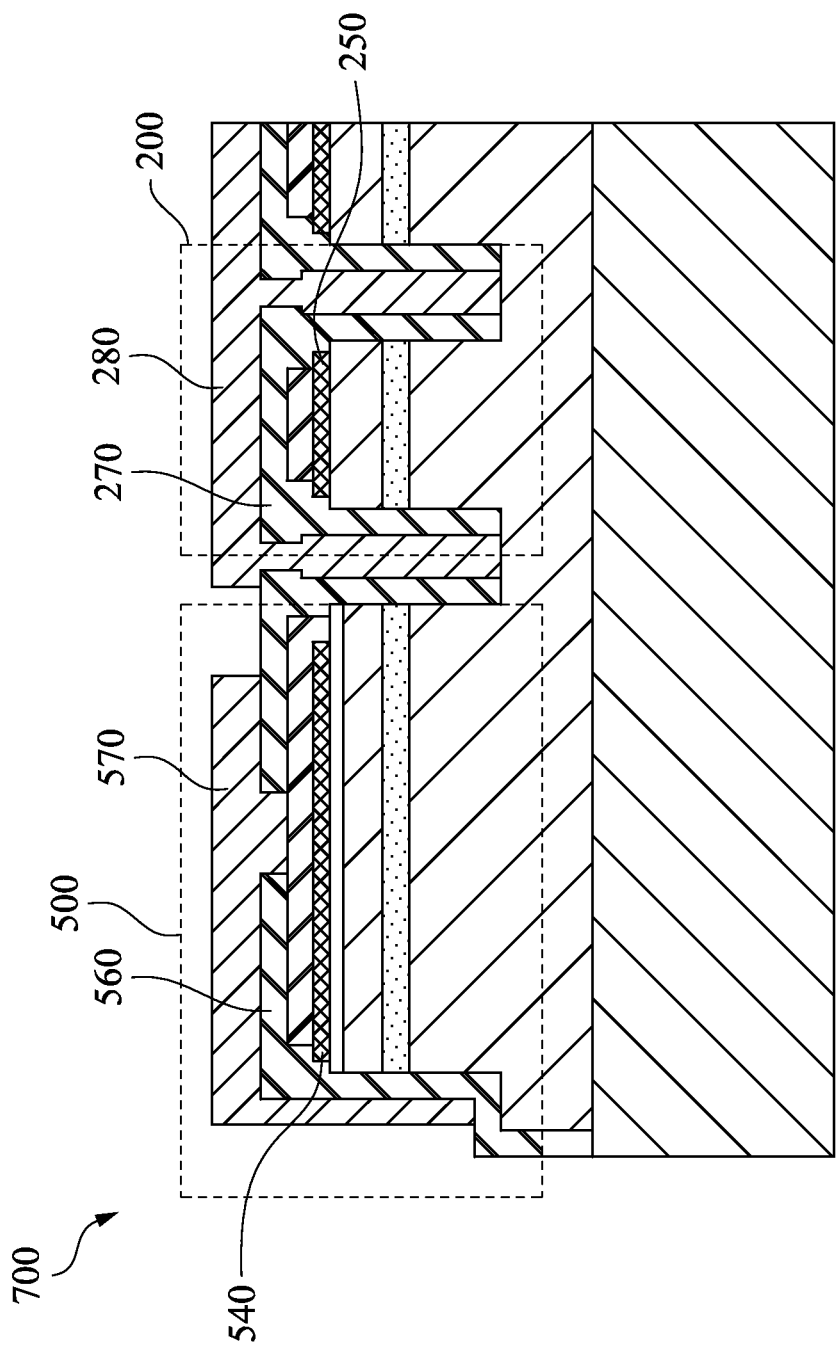
FIG. 3 is a cross-sectional view of the flip-chip light emitting diode chip according to another embodiment of the present invention.

FIG. 3 is a cross-sectional view of the flip-chip light emitting diode chip 700 according to another embodiment of the present invention. The flip-chip light emitting diode chip 700 of the embodiment includes the first semiconductor structure 200 and the second semiconductor structure 500. Through the first electrical contact layer 280 of the first semiconductor structure 200 and the second electrical contact layer 570 of the second semiconductor structure 500, the flip-chip light emitting diode chip 700 can be controlled and operated electrically.

Since the first semiconductor structure 200 and the second semiconductor structure 500 of the flip-chip light emitting diode chip 700 of this embodiment is illustrated in the embodiments of FIG. 1 and FIG. 2, the relevant configuration thereto is not repeated herein.

As the previously description, the first semiconductor structure 200 and the second semiconductor structure 500 respectively include the first electrical contact layer 280 and the second electrical contact layer 570, which are made of metal materials. In this way, through the first electrical contact layer 280 and the second electrically contact layer 570 of metal materials, in addition to electrically controlling and operating the flip-chip light emitting diode chip 700, the path of water vapor transmitted from the outside, through the passivation layer 270 or the passivation layer 560, to invade the first reflective layer 250 and the second reflective layer 560 can be blocked, the area of the barrier layer is reduced, and therefore the areas of the first reflective layer 250 and the second reflective layer 560 can be larger than the used ones. That is, the reflective area is increased, and the efficiency of the output light is enhanced.

The present invention provides a flip-chip light emitting diode chip. By disposing the metal layer to increase the area of blocking water vapor invasion, protect the reflective layer from oxidation, and increase the reflective range, the intensity of the output light, reliability, and lifetime of light emitting diodes are enhanced.

Although the present invention has been disclosed in the above embodiments, but it should not be used to limit the present invention. It will be apparent to those skilled in the art that various modifications and variations can be made to the present invention without departing from the scope or spirit of the invention. In view of the foregoing, it is intended that the scope of present invention is defined in the following claims.

What is claimed is:

1. A flip-chip light emitting diode chip, comprising:
a first semiconductor structure comprising:
a first P-type semiconductor layer, a first active layer, and a first N-type semiconductor layer, wherein the first active layer is disposed between the first P-type semiconductor layer and the first N-type semiconductor layer;
a plurality of first openings penetrating through the first P-type semiconductor layer and the first active layer, and partially penetrating the first N-type semiconductor layer, wherein a part of the first N-type semiconductor layer is exposed through the first openings;
a first reflective layer disposed on the first P-type semiconductor layer;
a first barrier layer disposed on the first reflective layer, wherein an area of the first barrier layer is smaller than an area of the first reflective layer, whereby the first reflective layer is exposed from the first barrier layer;
a passivation layer disposed on the first barrier layer and partially filling the first openings to cover exposed surfaces of the first P-type semiconductor layer, the first active layer, the first N-type semiconductor layer, the first reflective layer, and the first barrier layer, wherein the passivation layer is in contact with the exposed part of the first N-type semiconductor layer; and
a first electrical contact layer disposed on the passivation layer and partially penetrating the passivation layer to be in contact with the exposed part of the first N-type semiconductor layer.

2. The flip-chip light emitting diode chip of claim 1, wherein a reflectance of the first reflective layer is greater than a reflectance of the first barrier layer.

3. The flip-chip light emitting diode chip of claim 2, wherein the first electrical contact layer comprises a first contact pad and a plurality of first extension portions, the first contact pad is disposed on the passivation layer, and the first extension portions extend from the first contact pad toward the first openings and penetrate through the passivation layer to be in contact with the exposed part of the first N-type semiconductor layer.

4. The flip-chip light emitting diode chip of claim 3, wherein the first contact pad and the first extension portions are made of metal.

5. The flip-chip light emitting diode chip of claim 1, wherein the first semiconductor structure comprises a first transparent conductive layer, disposed between the first P-type semiconductor layer and the first reflective layer.

6. The flip-chip light emitting diode chip of claim 1, further comprising a second semiconductor structure comprising:
a second P-type semiconductor layer, a second active layer, and a second N-type semiconductor layer, wherein the second active layer is disposed between the second P-type semiconductor layer and the second N-type semiconductor layer;
a second reflective layer disposed on the second P-type semiconductor layer;
a second barrier layer disposed on the second reflective layer, wherein the passivation layer covers exposed surfaces of the second P-type semiconductor layer, the second active layer, the second N-type semiconductor layer, the second reflective layer, and the second barrier layer; and
a second electrical contact layer disposed on the passivation layer and partially penetrating through the passivation layer to be in contact with the second barrier layer.

* * * * *